(12) United States Patent
Lin et al.

(10) Patent No.: US 11,485,043 B2
(45) Date of Patent: Nov. 1, 2022

(54) ADDITIVE MANUFACTURING APPARATUS UTILIZING COMBINED ELECTRON BEAM SELECTIVE MELTING AND ELECTRON BEAM CUTTING

(71) Applicant: Tsinghua University, Beijing (CN)

(72) Inventors: Feng Lin, Beijing (CN); Bin Zhou, Beijing (CN); Wentao Yan, Beijing (CN); Hongxin Li, Beijing (CN); Lei Zhang, Beijing (CN); Ting Zhang, Beijing (CN); Chao Guo, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 389 days.

(21) Appl. No.: 16/479,181

(22) PCT Filed: Jan. 17, 2018

(86) PCT No.: PCT/CN2018/073024
§ 371 (c)(1),
(2) Date: Aug. 30, 2019

(87) PCT Pub. No.: WO2018/133799
PCT Pub. Date: Jul. 26, 2018

(65) Prior Publication Data
US 2020/0238566 A1     Jul. 30, 2020

(30) Foreign Application Priority Data
Jan. 22, 2017   (CN) .......................... 201710047601.1

(51) Int. Cl.
*B28B 1/00*     (2006.01)
*B33Y 30/00*    (2015.01)
(Continued)

(52) U.S. Cl.
CPC .............. *B28B 1/001* (2013.01); *B22F 10/00* (2021.01); *B22F 10/20* (2021.01); *B22F 10/28* (2021.01);
(Continued)

(58) Field of Classification Search
CPC .. B28B 1/001; B23K 15/0013; B23K 15/002; B23K 15/0033; B23K 15/004;
(Continued)

(56) References Cited

U.S. PATENT DOCUMENTS 3,382,328 A * 5/1968 Gerard .................. H01J 37/248
                                                191/12 R
2007/0286958 A1 * 12/2007 Slaughter ................ C23C 26/00
                                                427/375
(Continued)

FOREIGN PATENT DOCUMENTS

CN          104759623       7/2015
CN          105081320       11/2015
(Continued)

OTHER PUBLICATIONS

Markl, Matthias. "Numerical modeling and simulation of selective electron beam melting using a coupled lattice Boltzmann and discrete element method." Sep. 2015 (Year: 2015).*
(Continued)

*Primary Examiner* — John J Norton
*Assistant Examiner* — Simpson A Chen
(74) *Attorney, Agent, or Firm* — Hodgson Russ LLP (57) ABSTRACT

An additive manufacturing apparatus utilizing combined electron beam selective melting and electron beam cutting. One electron beam emitting, focusing, and scanning device (6) is capable of emitting electron beams (67, 68) in three modes of heating, selective melting, and electron beam cutting. The electron beam in the heating mode is emitted to
(Continued)

scan and preheat a powder bed (7). The electron beam (67) in the selective melting mode is emitted to scan and melt powder (71) in a section outline to form a section layer of a component. The electron beam (68) in the electron beam cutting mode is emitted to perform one or more cutting scans on inner and outer outlines (74, 75) of a section of the component to obtain accurate and smooth inner and outer outlines of the section. The heating, melting deposition, and outline cutting processes are repeated to obtain a required three-dimensional physical component.

5 Claims, 7 Drawing Sheets (51) Int. Cl.
*B33Y 50/02* (2015.01)
*B33Y 40/20* (2020.01)
*B23K 15/00* (2006.01)
*B23K 15/06* (2006.01)
*B23K 15/08* (2006.01)
*B22F 10/20* (2021.01)
*B22F 10/32* (2021.01)
*B22F 10/36* (2021.01)
*B22F 10/00* (2021.01)
*B22F 12/45* (2021.01)
*B22F 10/28* (2021.01)
*B22F 12/50* (2021.01)
*B33Y 10/00* (2015.01)
*H01J 37/04* (2006.01)
*B22F 10/30* (2021.01)

(52) U.S. Cl.
CPC .............. *B22F 10/32* (2021.01); *B22F 10/36* (2021.01); *B22F 12/45* (2021.01); *B22F 12/50* (2021.01); *B23K 15/002* (2013.01); *B23K 15/004* (2013.01); *B23K 15/0013* (2013.01); *B23K 15/0033* (2013.01); *B23K 15/0086* (2013.01); *B23K 15/06* (2013.01); *B23K 15/08* (2013.01); *B33Y 10/00* (2014.12); *B33Y 30/00* (2014.12); *B33Y 40/20* (2020.01); *B33Y 50/02* (2014.12); *H01J 37/04* (2013.01); *B22F 10/30* (2021.01)

(58) Field of Classification Search
CPC .... B23K 15/0086; B23K 15/06; B23K 15/08; B33Y 30/00; B33Y 50/02; B33Y 40/20; B22F 10/20; B22F 10/30
USPC .......................................................... 219/72
See application file for complete search history.

(56) References Cited

U.S. PATENT DOCUMENTS

| 2015/0306699 | A1* | 10/2015 | Honda ............... B23K 15/0086 264/430 |
| 2017/0106593 | A1* | 4/2017 | Khairallah ............. B33Y 30/00 |
| 2017/0165792 | A1* | 6/2017 | Buller .................. B23K 26/144 |
| 2017/0189960 | A1* | 7/2017 | Ibe ........................ B22F 1/0014 |
| 2018/0117845 | A1* | 5/2018 | Buller .................... B29C 64/386 |
| 2019/0337085 | A1* | 11/2019 | Hamaguchi ............ B33Y 10/00 |

FOREIGN PATENT DOCUMENTS

| CN | 106825567 | 6/2017 |
| EP | 2918396 | 9/2015 |
| JP | 2015168228 | 9/2015 |
| RU | 2401179 | 10/2010 |
| WO | 2016103493 | 6/2016 |

OTHER PUBLICATIONS

JPO, Office Action for JP Application No. 2019-539168, dated Sep. 1, 2020.
EPO, Extended European Search Report for EP Application No. 18741301.8, dated Nov. 23, 2020.
WIPO, ISR for PCT/CN2018/073024, Apr. 17, 2018.
FSIP, Office Action for RU Application No. 2019126338, dated Mar. 2, 2020.
SIPO, First Office Action for CN Application No. 201710047601.1, dated May 24, 2018.

* cited by examiner

ADDITIVE MANUFACTURING APPARATUS UTILIZING COMBINED ELECTRON BEAM SELECTIVE MELTING AND ELECTRON BEAM CUTTING

CROSS-REFERENCE TO RELATED APPLICATIONS

This application is a U.S. national phase application of International Application No. PCT/CN2018/073024, filed on Jan. 17, 2018, which claims priority to Chinese Patent Application 201710047601.1, filed on Jan. 22, 2017, the entire disclosures of which are incorporated herein by reference.

FIELD

The present disclosure relates to a field of additive manufacturing, more particularly to an additive manufacturing apparatus which obtain a three-dimensional component of high performance, high efficiency and high precision by using electron beam selective melting to heat material so as to sinter or melt-deposit the material layer by layer, and using the electron beam to cut an outline of a forming material so as to separate the forming material from powder.

BACKGROUND

Electron beam selective melting (EBSM) is a typical additive manufacturing process, which has great advantages in three-dimensional forming of complex structures and special materials. The electron beam selective melting process uses high-energy electron beam as a heat source to sinter or melt powder material layer by layer, so that the material is accumulated layer by layer for formation.

However, similar to other additive manufacturing processes, a surface roughness of a component manufactured by the electron beam selective melting process is worse, and subsequent processes of machining or polishing are needed to improve surface finish and surface accuracy of the component. These follow-up processing steps not only reduce manufacturing efficiency of the component, but also, more importantly, some positions (such as inner channels, etc.) which cannot be accessed by cutting tools cannot be machined, and surface quality of these positions cannot be improved. Therefore, the relatively worse surface finish of the component has become a bottleneck problem in additive manufacturing technology.

In order to overcome this bottleneck problem, some on-line cutting processing methods, i.e. an idea of hybrid process which combines additive manufacturing process with subtractive manufacturing process, are put forward to improve the surface quality of additive manufacturing components in related arts. Patent applications CN104741609A, CN104526359A and CN105945578A separately proposes to combine mechanical subtractive manufacturing and laser cutting to cut a section outline of a work piece in real time by mechanical milling head or laser during a process of the electron beam selective melting and fuse-forming, so as to improve the accuracy and the surface finish of the components.

Although cutting process is incorporated into the on-line additive manufacturing process, separate cutting tools or laser systems are required in these disclosures. Either the work piece needs to move iteratively between an additive work position and a subtractive work position, affecting the processing accuracy (e.g. CN104741609A and CN105945578A); or the two systems of additive and subtractive manufacturing cannot be in an optimal processing position simultaneously (e.g. an electron beam emitting structure and a laser cutting head cannot be in the optimal position which is directly above the forming/processing area simultaneously according to CN104526359A), affecting the processing quality as well. The additional cutting device (a milling cutter or laser cutting system) would make the entire system much more complex.

Patent application CN105538728A proposes to use a pulsed laser beam to scan an outline edge to remove surface unevenness during an additive manufacturing process of laser selective melting, so as to improve the surface finish of the component. The same galvanometer scanning system is used for leading both continuous laser and pulsed laser emitted from different laser sources for a hybrid process of additive manufacturing and subtractive manufacturing in this patent. Although it avoids the aforementioned structural interference problem that two laser scanning systems of additive manufacturing and subtractive manufacturing cannot be in the optimal processing position at the same time, it still needs to install two laser systems and optical path integration systems with different properties, which increases apparatus cost and debugging difficulty.

In addition, in order to prevent oxidation when the laser melt the material and contamination of the laser lens when the material evaporated, the laser selective melting process proposed in the patent needs to be performed in inert protective atmosphere with positive pressure greater than a barometric pressure, which greatly limits material cutting efficiency of pulsed laser. In addition, this disclosure proposes to use pulsed laser to scan the outline edge to "remove the surface unevenness", which needs to cut a greater amount of material, hence further increases the difficulty in implementing this disclosure.

SUMMARY

This application is based on the inventor's discoveries and understandings of the following facts and problems:

In all current electron beam selective melting processes, an electron beam is only used as a heat source for preheating, melting, heat preservation and forming of the powder material, and for sintering or melting the powder material layer by layer, so that the forming material is accumulated layer by layer, to achieve a purpose of "adding material" in additive manufacturing. Usually, with regard to the problem of low surface finish of components in the electron beam selective melting process, the surface quality is improved by means of "removing material" in the subsequent process. In this way, not only the overall efficiency of components manufacturing is reduced, new problems such as the inner channel cannot be processed exist.

In the process of electron beam selective melting, a digital control system can be adopted to greatly enhance the scanning accuracy and the ability of scanning arbitrary graphs by the electron beam. The parameters of electron beam and scanning needed for the electron beam selective melting and electron beam cutting can be integrated in one electron beam generation, acceleration, focusing and scanning system, which can realize the additive and subtractive hybrid manufacturing by using only one electron gun (including functions of electron beam generation, acceleration, focusing and scanning) for not only selective melting but also outline cutting by adopting different working parameters (low-speed scanning and high-speed scanning) or working modes (continuous beams and pulsed beams). It does not need to adopt laser of different properties (continuous laser and ultrashort pulsed laser) which are required in the laser selective melting and laser cutting.

In this way, it simplifies the system as well as reduces the apparatus cost. At the same time, material gasification is much easier in vacuum environment of the electron beam selective melting, and the cutting efficiency of the electron beam is higher than that of laser. Compared with the additive and subtractive technology by adding dedicated cutting positions or cutting tools (e.g. patent applications CN104741609A, CN104526359A and CN105945578A), the system is much simpler. Moreover, one set of scanning and processing system achieves both the "additive manufacturing" and "subtractive manufacturing", which can effectively guarantee the processing accuracy.

The purpose of the present disclosure is to present a new additive manufacturing apparatus which combines the electron beam selective melting and electron beam cutting to achieve the formation of complex three-dimensional components.

According to an embodiment of the present disclosure, the additive manufacturing apparatus utilizing combined electron beam selective melting and electron beam cutting, including: a vacuum forming chamber; a workbench, a forming area of the workbench being provided at least in the vacuum forming chamber; a powder supply device configured to spread powder onto the forming area to form a powder bed with a certain thickness; at least one electron beam emitting, focusing and scanning device, a scanning range of the electron beam emitting, focusing and scanning device covering at least a part of the forming area; a controller configured to control each of the electron beam emitting, focusing and scanning device to operate to emit an electron beam in three modes of heating, selective melting and electron beam cutting. The powder supply device spreads the powder onto the forming area to form a powder bed with the certain thickness. The electron beam emitting, focusing and scanning device emits the electron beam in the heating mode, and the electron beam scans and preheats the powder bed in order to heat and slight-sinter the powder. The electron beam emitting, focusing and scanning device emits the electron beam in the selective melting mode, and the electron beam scans and melts the powder in a section in order to melt and deposit the powder to form a section layer of a required component. The electron beam emitting, focusing and scanning device emits the electron beam in the electron beam cutting mode, and the electron beam scans and cuts inner and outer outlines of a section of the component once or for a plurality of times to remove or cut off a rough edge and welded powder at the outlines in order to obtain precise and smooth inner and outer outlines of the section of the component. The powder is spread on the section layer of the component with the cut section outlines, and the heating, melting deposition and outline cutting are carried out in sequence. A manufacturing process of spreading, heating, melting deposition and outline cutting layer by layer is repeated until a required three-dimensional solid component is obtained.

In the additive manufacturing apparatus utilizing combined electron beam selective melting and electron beam cutting proposed in the present disclosure, the electron beam emitting, focusing and scanning device is enabled to have the functions of heating the powder bed, selective melting deposition and cutting the inner and outer outlines of the section of the components by changing emission parameters and scanning parameters of the electron beams in the process of electron beam selective melting, so that the electron beam selective melting and electron beam cutting are combined to achieve the hybrid process of additive manufacturing and subtractive manufacturing.

Utilizing a functional integration of the electron beam emitting, focusing and scanning device, while powder material experiences the electron beam selective melting, the section outline of a freshly deposited component is cut by the electron beam to remove or cut off the rough edges and welded powder at the outline so as to obtain precise and smooth inner and outer section outlines of the component. In this way, the process of electron beam selective melting deposition (that is "adding material" process) and the process of electron beam cutting of inner and outer outlines (that is "removing material" process) are alternately carried out to ensure that the three-dimensional solid components with higher dimensional accuracy and surface finish are finally obtained, especially to ensure the surface finish and the precision of the difficult-to-machine parts such as the inner channels of the components.

In addition, the additive manufacturing apparatus utilizing combined electron beam selective melting and electron beam cutting can also have the following additional technical features.

According to an embodiment of the present disclosure, a pressure of the vacuum forming chamber is less than 10 Pa and the vacuum forming chamber is refilled with inert gas to prevent the excess of disproportionate element evaporation. The inert gas includes but not limited helium, argon and nitrogen.

According to an embodiment of the present disclosure, the pressure of the vacuum forming chamber is between 1 Pa and $10^{-3}$ Pa.

According to an example of the present disclosure, an acceleration voltage of the electron beam emitted by the electron beam emitting, focusing and scanning device varies from 10 kV to 200 kV.

According to an example of the present disclosure, the electron beam emitting, focusing and scanning device is able to generate a continuous electron beam and a pulsed electron beam.

According to an embodiment of the present disclosure, a scanning speed of the electron beam emitted by the electron beam emitting, focusing and scanning device in the forming area varies arbitrarily from 0 to 100 m/s.

According to an embodiment of the present disclosure, in the heating mode, the electron beam emitted by the electron beam emitting, focusing and scanning device focuses above or below a forming plane, a scanning speed is from 0.01 m/s to 50 m/s, two adjacent scanning paths do not overlap each other, and a scanning interval is greater than 10 microns.

According to an embodiment of the present disclosure, in the selective melting mode, the electron beam emitted by the electron beam emitting, focusing and scanning device focuses on a forming plane, a scanning speed is from 0.01 m/s to 10 m/s, two adjacent scanning paths do not overlap each other, and a scanning interval is greater than 10 microns.

According to an embodiment of the present disclosure, in the selective melting mode, the electron beam emitting, focusing and scanning device regulates a melting depth by adjusting beam intensity, a moving speed of a focus on a forming plane, a scanning interval of adjacent scanning paths and an interval time of the adjacent scanning paths. For an area where a component entity is below a current forming layer and the current forming layer needs to fuse with the component entity, the melting depth exceed a thickness of the current forming layer; for another area where the powder bed or a cut edge of outline is below the current forming layer, the melting depth is equal to or less than the thickness of the current forming layer.

According to an embodiment of the present disclosure, in the electron beam cutting mode, a continuous electron beam emitted by the electron beam emitting, focusing and scanning device is focused on a plane of the section of the component, a scanning speed is from 1 m/s to 50 m/s, and two adjacent scanning paths overlap and a scanning interval is less than 8 microns.

According to an embodiment of the present disclosure, in the electron beam cutting mode, a pulsed electron beam emitted by the electron beam emitting, focusing and scanning device focuses on a plane of the section of component, a pulse frequency is 1 Hz to 100 kHz, a scanning speed is 0.1 m/s to 5 m/s, and two adjacent scanning paths overlap each other and a scanning interval is less than 8 microns.

According to an embodiment of the present disclosure, the electron beam emitting, focusing and scanning device is arranged at a top of the vacuum forming chamber and directly above the forming area.

According to an embodiment of the present disclosure, the powder includes ceramic powder and/or metal powder.

Further, the electron beam emitting, focusing and scanning device is movable relative to the workbench so as to expand the scanning range.

Furthermore, the workbench is moveably disposed in the vacuum forming chamber so as to expand the scanning range.

According to an embodiment of the present disclosure, two electron beam emitting, focusing and scanning devices are provided, the electron beam emitted by each electron beam emitting, focusing and scanning device has three modes of heating, selective melting and electron beam cutting, scanning areas of the two electron beam emitting, focusing and scanning devices overlap at edge portions, and at least 90% of the scanning areas do not overlap.

According to an embodiment of the present disclosure, at least four electron beam emitting, focusing and scanning devices arranged in an array are provided, the electron beam emitted by each electron beam emitting, focusing and scanning device has three modes of heating, selective melting and electron beam cutting, scanning areas of every electron beam emitting, focusing and scanning device overlap at edge portions, and at least 80% of the scanning areas do not overlap.

According to an embodiment of the present disclosure, the workbench includes: an operation platform, the forming area being provided in the operation platform; and a piston-type forming cylinder device disposed below the operation platform and including a forming cylinder and a piston-type elevating device. An upper edge of the forming cylinder is flush with the operation platform, and the piston-type elevating device is able to move up and down in the forming cylinder.

According to an embodiment of the disclosure, the powder supply device includes: a powder feeder configured to supply the powder to an upper surface of the operation platform; and a powder spread device provided on the operation platform and configured to disperse the powder into a forming cylinder and flatten the powder.

According to an embodiment of the present disclosure, the electron beam emitting, focusing and scanning device includes: a casing provided outside the vacuum forming chamber; a filament configured to generate an electron beam and provided in the casing; a cathode provided in the casing and linked to the filament; a grid electrode provided in the casing and located below the filament; an anode provided in the casing and located below the grid electrode; a focusing coil provided in the casing and located below the anode; and a pair of X/Y deflection coils provided in the casing and located below the focusing coil.

Additional aspects and advantages of the present disclosure will be given in the following description part, which will become apparent from the following description or be understood through practices of the present disclosure.

DETAILED DESCRIPTION

Embodiments of the present disclosure are described in detail below. The examples of embodiments are illustrated in the attached drawings, and thereof throughout the embodiments, the same or similar labels represent the same or similar elements or elements with the same or similar functions. The following embodiments described herein with reference to drawings are exemplary, and the embodiments are used to generally explain the present disclosure. The embodiments shall not be understood to limit the present disclosure.

The following statements combined with attached drawings are the detailed descriptions about an additive manufacturing apparatus according to an embodiment of the present disclosure.

As illustrated in FIG. 1 to FIG. 10, according to an embodiment of the present disclosure, the additive manufacturing apparatus utilizing combined electron beam selective melting and cutting may include a vacuum forming chamber 1, a workbench, a powder supply device, at least one electron beam emitting, focusing and scanning device 6 and a controller (not illustrated).

Figure 1:
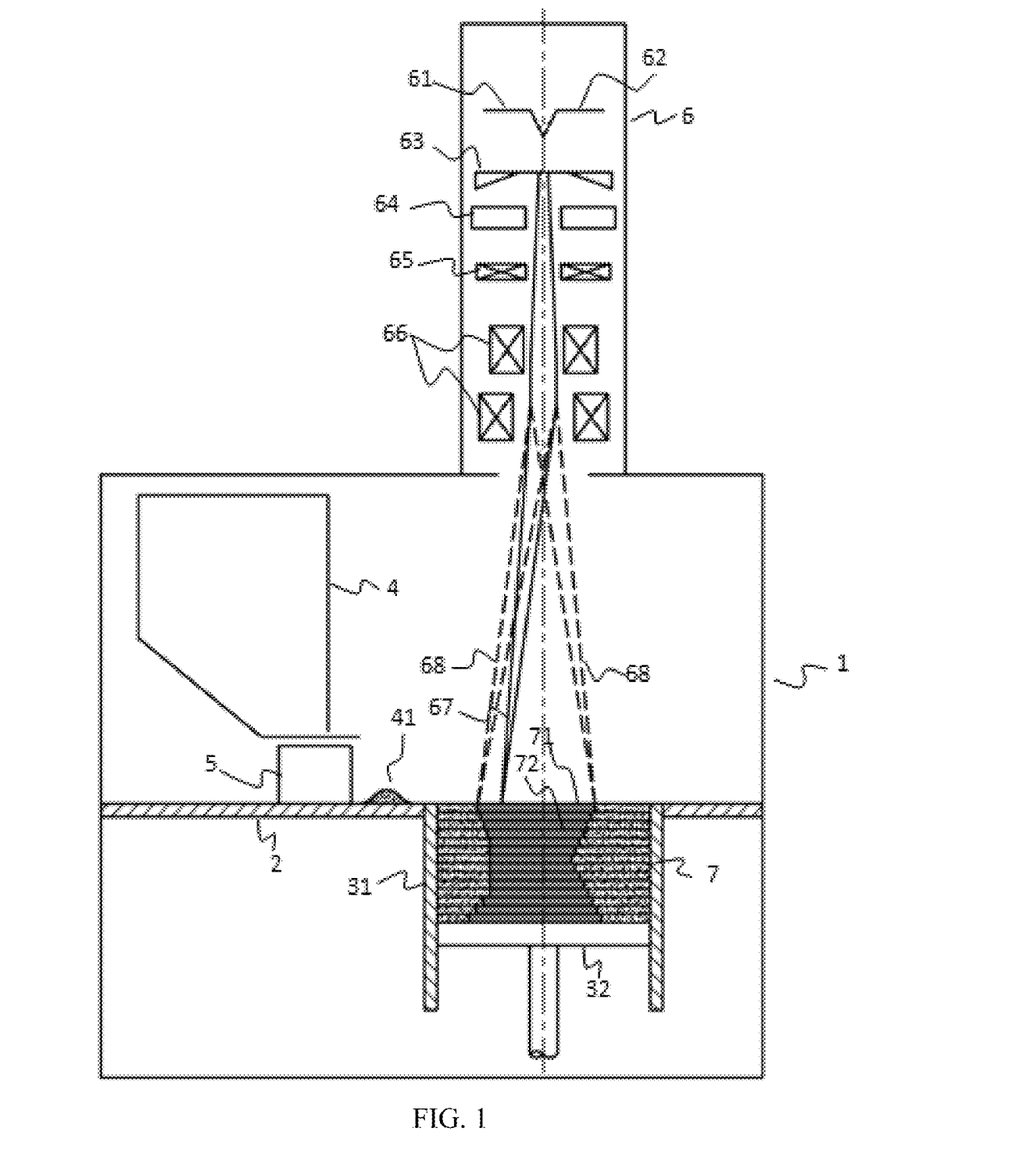
FIG. 1 is a schematic view of an additive manufacturing apparatus utilizing combined electron beam selective melting and cutting according to an embodiment of the present disclosure.

Specifically, a forming area of the workbench is provided at least in the vacuum forming chamber 1.

According to an embodiment of the present disclosure, a pressure of the vacuum forming chamber 1 is less than 10 Pa and the vacuum forming chamber is refilled with inert gas to prevent the excess of disproportionate element evaporation. The inert gas includes but not limited helium, argon and nitrogen. Preferably, the pressure of the vacuum forming chamber is between 1 Pa and $10^{-3}$ Pa.

According to an embodiment of the present disclosure, the workbench includes an operation platform 2 and a piston-type forming cylinder device. The forming area is provided in the operation platform 2. The piston-type forming cylinder device is disposed below the operation platform 2 and includes a forming cylinder 31 and a piston-type elevating device 32. An upper edge of the forming cylinder 31 is flush with the operation platform 2. The piston-type elevating device 32 can move up and down in the forming cylinder 31.

The powder supply device is used for supplying powder to the forming area. According to an embodiment of the present disclosure, the powder may be at least one of ceramic powder and metal powder. However, it should be noted that, based on the needs of the additive manufacturing components, the powder can be selected from suitable material, which is within the protection scope of the present disclosure.

According to an embodiment of the present disclosure, the powder supply device may include a powder feeder 4 and a powder spread device 5. As illustrated in FIG. 1, the powder feeder 4 supplies the powder to an upper surface of the operation platform 2. The powder spread device 5 is provided on the operation platform 2 and able to disperse the powder into the forming cylinder 31 and flatten the powder.

The electron beam emitting, focusing and scanning device 6 is configured such that the scanning range thereof covers at least a part of the forming area, and the specific scanning range can be designed according to the forming requirements. As illustrated in FIG. 1, in some embodiments of the present disclosure, from top to bottom, the electron beam emitting, focusing and scanning device 6 is provided with a filament 61, a cathode 62, a grid electrode 63, an anode 64, a focusing coil 65 and a pair of scanning deflection coils 66. The pair of scanning deflection coils 66 includes an X-direction deflection winding and a Y-direction deflection winding.

Each electron beam emitting, focusing and scanning device 6 can emit the electron beam for single or a plurality of beam scanning. Each electron beam has enough power, three modes of heating, selective melting and electron beam cutting, and can heat, melt, sinter the material and cut an outline. In addition, the scanning, heating, melting, sintering and cutting outlines should be broadly understood in the field of material processing. For example, heating may include continuous or intermittent preheating, heating, and etc.

Figure 2:
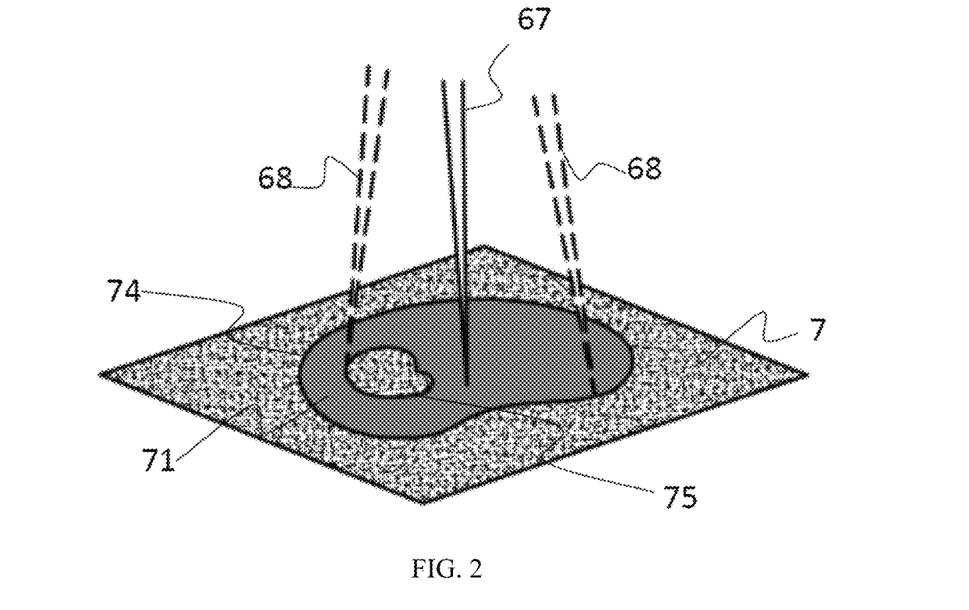
FIGS. 2 to 7 are schematic views of an area for electron beam selective melting and cutting of the apparatus illustrated in FIG. 1.
Figure 3:
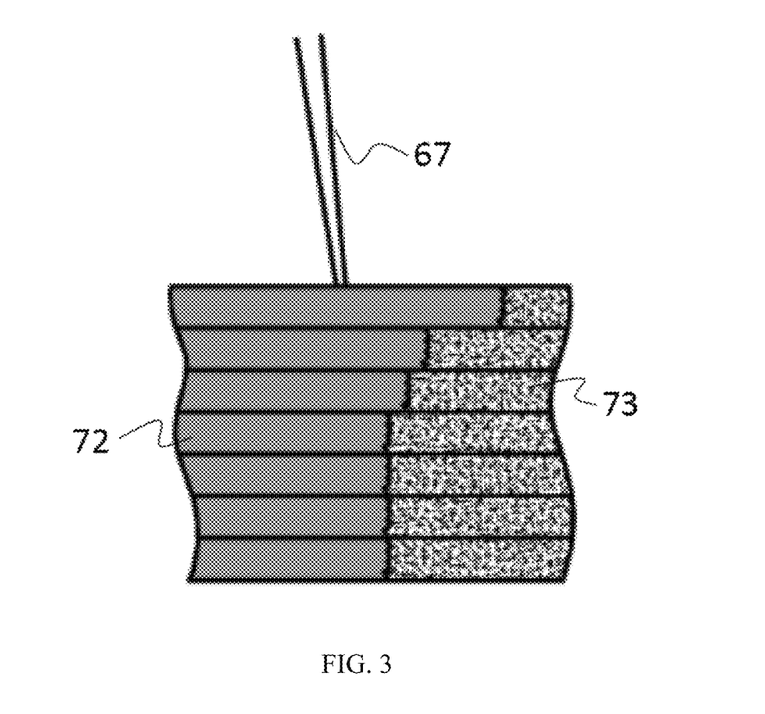

Specifically, as illustrated in FIGS. 2 and 3, when practically using the additive manufacturing apparatus according to the embodiment of the present disclosure, the electron beam 67 emitted by the electron beam emitting, focusing and scanning device 6 can be used for scanning the forming area under the control of the controller. Firstly, the electron beam emitting, focusing and scanning device 6 can be used for emitting the electron beam in the heating mode, and the electron beam scans and preheats the powder bed so as to heat and slight-sinter the powder. Then, the electron beam emitting, focusing and scanning device 6 is used for emitting the electron beam in the selective melting mode and the electron beam scans and melts the powder in a section so as to melt and deposit the powder to form a section layer of a required component. Afterwards, the electron beam emitting, focusing and scanning device 6 is utilized to emit the electron beam in the electron beam cutting mode, and the electron beam scans and cuts inner and outer outlines of a section of the component once or for a plurality of times to remove or cut off a rough edge and welded powder on the outlines so as to obtain precise and smooth inner and outer outlines of the section of the component. In addition, powder is spread on the section layer of the component with the cut section outlines, and the heating, melting deposition and outline cutting are carried out in sequence, a manufacturing process of spreading, heating, melting deposition and outline cutting layer by layer is repeated until a required three-dimensional solid component is obtained.

Thus, the material in the section can be gradually warmed up, sintered and melted to form a clear, continuous and complete section and section outline. In the manufacturing process, the additive manufacturing and subtractive manufacturing can be performed simultaneously, subsequent processing is needless or reduced, and high-performance and high-precision components can be obtained.

In the additive manufacturing apparatus according to the embodiment of the present disclosure, the electron beam emitting, focusing and scanning device 6 can be controlled to emit the electron beam with different parameters by means of the controller. The electron beam can heat, melt, sinter the material and cut the outline in the forming area flexibly during the manufacturing process. The additive manufacturing and subtractive manufacturing can be achieved simultaneously by combining the electron beam selective melting and the outline cutting, high-performance and high-precision components can be obtained during the manufacturing process, and the subsequent processing is needless or reduced.

An acceleration voltage of the electron beam emitted by the electron beam emitting, focusing and scanning device 6 can vary from 10 kV to 200 kV. A scanning speed of the electron beam emitted by the electron beam emitting, focusing and scanning device 6 in the forming area can vary arbitrarily from 0 to 100 m/s. As a result, the acceleration voltage and scanning speed of the electron beam of the electron beam emitting, focusing and scanning device 6 can be controlled to vary in a certain range by means of the controller. The electron beam can have different energy and interaction time to achieve the functions of heating, melting, sintering and cutting outlines.

In some embodiments of the disclosure, in the heating mode, the electron beam emitted by the electron beam emitting, focusing and scanning device 6 can focus above or below a forming plane. The scanning speed is from 0.01 m/s to 50 m/s, two adjacent scanning paths do not overlap each other, and the scanning interval is greater than 10 microns. Thus, better heating effect and heating efficiency can be achieved. For example, the scanning speed of the electron beam in the heating mode can be 10 m/s, 20 m/s, 30 m/s or 40 m/s, and etc., and the scanning interval between the two adjacent scanning paths can be 15 micron, 20 micron or 25 micron, and etc.

In the selective melting mode, the electron beam emitted by the electron beam emitting, focusing and scanning device 6 can focus on the forming plane. The scanning speed is from 0.01 m/s to 10 m/s, two adjacent scanning paths do not overlap each other, and the scanning interval is greater than 10 microns. The melting and sintering effect is good and the sintering efficiency is high. For example, the scanning speed of the electron beam in the selective melting mode can be 1 m/s, 3 m/s, 5 m/s, 7 m/s or 9 m/s, and etc., and the scanning interval between the adjacent scanning paths can be 15 micron, 20 micron or 25 micron, and etc.

Furthermore, in the selective melting mode, the electron beam emitting, focusing and scanning device 6 can regulate a melting depth by adjusting beam intensity of the electron beam, a moving speed of a focus on the forming plane, the scanning interval of adjacent scanning paths and an interval time of the adjacent scanning paths, so as to ensure good melting and sintering effect.

In the present disclosure, the electron beam emitting, focusing and scanning device 6 can generate a continuous electron beam and pulsed electron beam. Advantageously, in the process of electron beam cutting, the electron beam can be the pulsed electron beam to ensure better cutting effect.

It should be noted that, during the electron beam cutting, if the energy density is not sufficient or the interaction time is too long, the material around the focus will be melted, and the part removed by gasification will be filled again. This will result in the failure to cut or lower the cutting efficiency. In addition, it will also cause temperature gradient effect, cracks, unsatisfactory cutting effect and low surface finish of the product. In order to improve the cutting effect, the inventor of this application has optimized some parameters of the electron beam cutting. This can significantly improve the cutting effect.

For example, in some embodiments of the present disclosure, in the electron beam cutting mode, the electron beam emitting, focusing and scanning device 6 emits the continuous electron beams. The continuous electron beams are focused on the plane of the section of the component at scanning speed of 1 m/s to 50 m/s, and the two adjacent scanning paths overlap completely or the scanning interval is less than 8 microns. Thus, the cutting depth can be effectively guaranteed. For example, in the mode of the electron beam cutting, the scanning speed of the electron beam can be 10 m/s, 20 m/s, 30 m/s or 40 m/s, and etc., and the scanning interval between the two adjacent scanning paths can be 0 micron, 2 micron, 4 micron or 6 micron, and etc.

For another example, in some other embodiments of the disclosure, in the electron beam cutting mode, the pulsed electron beam emitted by the electron beam emitting, focusing and scanning device 6 focuses on the plane of the section of the component. The pulse frequency is 1 Hz to 100 kHz and the scanning speed is 0.1 m/s to 5 m/s. The two adjacent scanning paths need to be overlapped or the scanning interval is less than 8 microns. The cutting effect is good. For example, in the mode of the electron beam cutting, the scanning speed of the electron beam can be 1 m/s, 2 m/s, 3 m/s or 4 m/s, and etc., and the scanning interval between two adjacent scanning paths can be 0 micron, 2 micron, 4 micron or 6 micron, and etc.

It should be noted that in the present disclosure, the scanning interval can be understood as a distance between two adjacent scanning path centerlines or two adjacent scanning trace centerlines formed by the electron beam scanning the powder bed or the section of the component, can also be understood as a distance between two adjacent scanning paths defined by a scanning data input to the controller of the electron beam emitting, focusing and scanning device.

As illustrated in FIG. 1, according to an embodiment of the present disclosure, the electron beam emitting, focusing and scanning device 6 is arranged at a top of the vacuum forming chamber 1 and directly above the forming area. As a result, not only the installation is facilitated, but also better forming effect is ensured.

Advantageously, the electron beam emitting, focusing and scanning device 6 is movable relative to the workbench. That is to say, a position of the electron beam emitting, focusing and scanning device 6 can be moved relative to the workbench so as to expand the scanning range. Furthermore, the workbench is moveable in the vacuum forming chamber 1 to further expand the scanning range of the electron beam emitting, focusing and scanning device 6.

Figure 8:
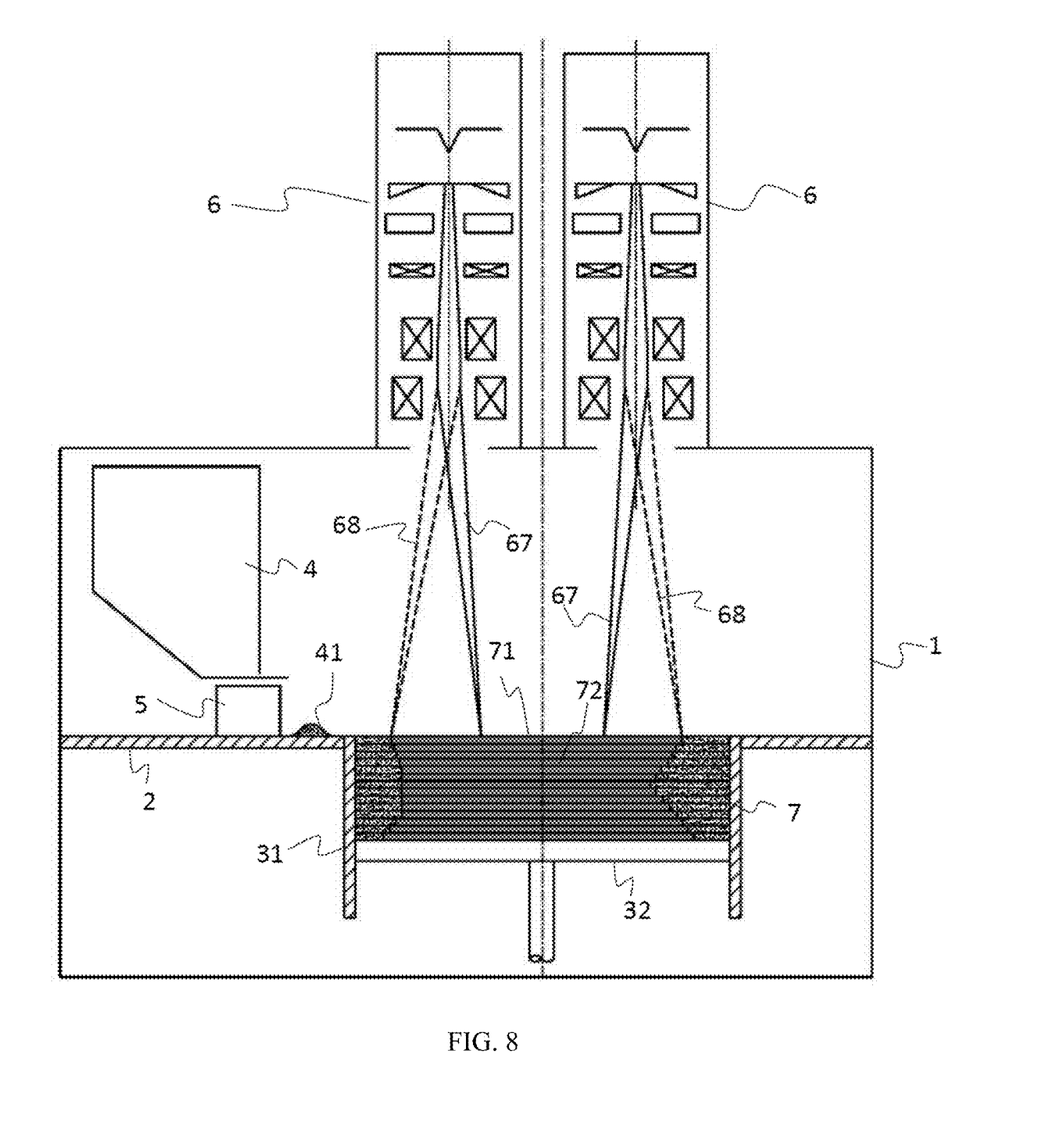
FIG. 8 is a schematic view of an additive manufacturing apparatus using combined electron beam selective melting and cutting according to another embodiment of the present disclosure.

As illustrated in FIG. 8, according to an embodiment of the present disclosure, two electron beam emitting, focusing and scanning devices 6 are provided, the electron beam emitted by each electron beam emitting, focusing and scanning device 6 has three modes of heating, selective melting and electron beam cutting, scanning areas of the two electron beam emitting, focusing and scanning devices 6 only overlap at edge portions, and at least 90% of the scanning areas do not overlap. As a result, the scanning range can be further expanded, and the additive manufacturing apparatus has better forming effect and higher forming efficiency.

Optionally, the two electron beam emitting, focusing and scanning devices 6 are arranged side by side at the top of the vacuum forming chamber 1. As a result, not only the installation is facilitated, but also the scanning range is expanded, hence the forming quality and the forming efficiency can be improved.

Figure 9:
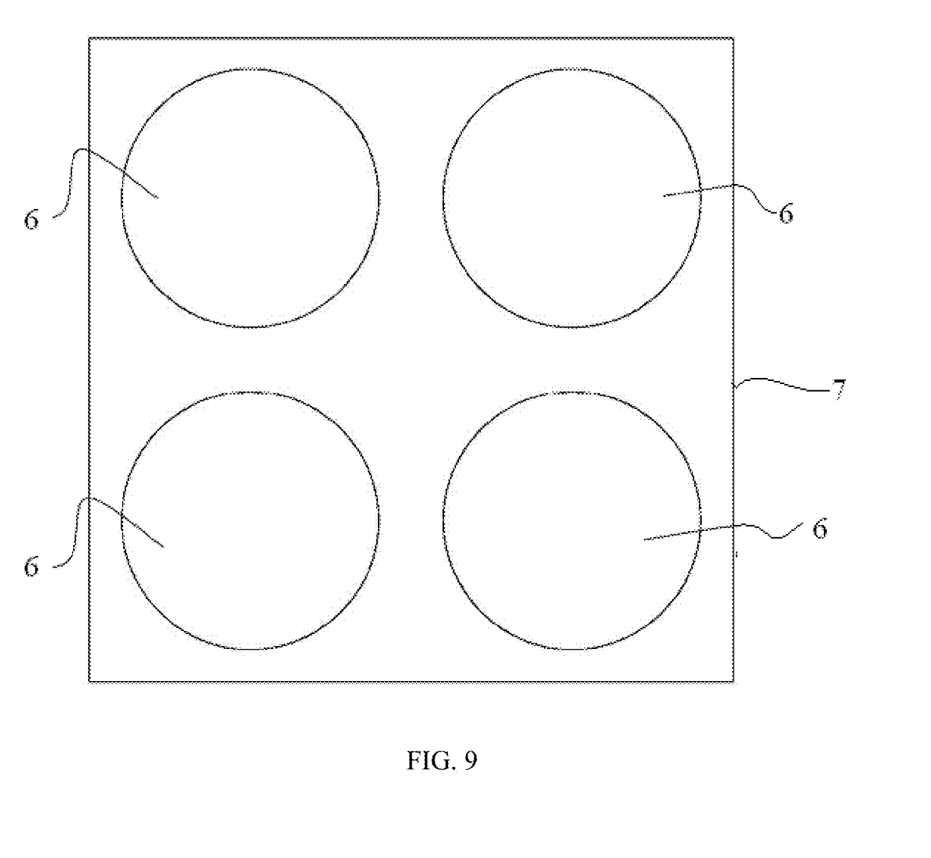
FIG. 9 is a schematic view of an additive manufacturing apparatus utilizing combined electron beam selective melting and cutting according to yet another embodiment of the present disclosure.

As illustrated in FIG. 9, according to an embodiment of the present disclosure, four electron beam emitting, focusing and scanning devices 6 are provided, and the electron beam emitting, focusing and scanning devices 6 can arranged in array. Each electron beam emitting, focusing and scanning device in the array has three modes of heating, selective melting and electron beam cutting, scanning areas of every electron beam emitting, focusing and scanning device 6 only overlap at edge portions, and at least 80% of the scanning areas do not overlap. As a result, the scanning range can be further expanded, and the additive manufacturing apparatus has better forming effect and higher forming efficiency.

Optionally, the four electron beam emitting, focusing and scanning devices 6 are arranged at the top of the vacuum forming chamber 1 in array. As a result, not only the installation is facilitated, but also the scanning range is expanded, hence the forming quality and the forming efficiency can be improved.

It should be noted that in the present disclosure, there is no special restriction on the number of the electron beam emitting, focusing and scanning device 6, and the number of the electron beam emitting, focusing and scanning device 6 can be three, five or more than five, which can be configured flexibly according to the specific situation.

According to an embodiment of the present disclosure, the electron beam emitting, focusing and scanning device 6 may include: a casing 60, a filament 61, a cathode 62, a grid electrode 63, an anode 64, a focusing coil 65 and a pair of deflection coils 66. The casing 60 is provided outside the vacuum forming chamber 1. The filament 61 is provided in the casing 60 to generate the electron beam. The cathode 62 is located in the casing 60 and linked to the filament 61. The grid electrode 63 is located in the casing 60 and below the filament 61. The anode 64 is located in the casing 60 and below the grid electrode 63. The focusing coil 65 is located in the casing 60 and below the anode 64. The pair of X/Y deflection coils 66 is located in the casing 60 and below the focusing coil 65.

In summary, according to the aforementioned additive manufacturing apparatus utilizing combined electron beam selective melting and cutting, the electron beam selective melting and outline cutting are combined to realize a simultaneous processing of additive manufacturing and subtractive manufacturing, thus achieving the selective melting additive manufacturing technology with high performance, high efficiency, high precision and wider material adaptability.

The scanning electron beam emitted by the electron beam emitting, focusing and scanning device can be used for scanning the forming area, preheating the powder and controlling the cooling process, so as to enable the temperature field of the forming area in an appropriate range, control the temperature gradient to reduce the thermal stress, scan the section of the component and the cut imer and outer outlines of the section, so the material in the section is gradually heated, sintered and melted to form a clear, continuous and complete section and section outline and form a component with higher performance and higher precision.

For a larger forming area, a plurality of electron beam emitting, focusing and scanning devices 6 can be arranged at the top of the vacuum chamber. The scanning areas of the plurality of electron beam emitting, focusing and scanning devices 6 are combined into a larger combined scanning area. There is no gap among the scanning areas of each electron beam emitting, focusing and scanning device 6, and the scanning areas of each electron beam emitting, focusing and scanning device 6 partially overlap or are adjacent, so as to avoid unscannable area in the forming area and affecting the manufacturing process.

For a larger forming area, at least one electron beam emitting, focusing and scanning device 6 can be moved relative to the operation platform 2 at the top of the vacuum forming chamber 1, so as to enlarge the scanning range. Optionally, for a larger forming area, the forming cylinder 31 and the operation platform 2 can move in the vacuum forming chamber to expand the scanning range of the electron beam emitting, focusing and scanning device.

Specific embodiments illustrated in FIG. 1-FIG. 10 are briefly described as follows.

Embodiment 1

As illustrated in FIG. 1, an additive manufacturing apparatus using the combined electron beam selective melting and cutting according to an embodiment of the present disclosure includes a vacuum forming chamber 1, an operation platform 2, a forming cylinder 31, a piston-type elevating device 32, a powder feeder 4, a powder spread device 5, an electron beam emitting, focusing and scanning device 6 and a control computer used as a controller.

The electron beam emitting, focusing and scanning device 6 includes a filament 61, a cathode 62, a grid electrode 63, an anode 64, a focusing coil 65 and a pair of deflection coils 66 for generating the electron beam. The generated electron beam 67 is used for scanning the forming area, heating, sintering and melting powder, and cutting the inner and outer outlines of the forming material.

The vacuum forming chamber 1 provides vacuum environment of a pressure less than 10 Pa, preferably of a pressure between 1 Pa and $10^{-3}$ Pa with inert gas refilled for the selective melting process, and the operation platform 2 is arranged horizontally in the middle.

The powder feeder 4 is located above the operation platform 2 for storing the powder and supplying powder 41 quantitatively.

The powder spread device 5 can move back and forth on the operation platform 2, disperse the powder in the forming area and flatten the powder.

The forming cylinder 31 is arranged below the operation platform 2 and includes a piston-type elevating device 32. A height-variable accommodating chamber defined by the piston-type elevating device 32 and the forming cylinder 31 contains a powder bed 7 and a formed work piece 72.

As illustrated in FIG. 1 and FIG. 2, a process of the additive manufacturing apparatus using the combined electron beam selective melting and cutting according to an embodiment of the present disclosure is as follows: when the previous layer of deposition is formed and the new layer of deposition begins to form, the piston-type elevating device 32 moves down relative to the operation platform 2 for a height equal to a thickness of one layer of powder, so that a height difference of the thickness of one layer of power is formed between an upper surface of the powder bed 7 and the surface of the operation platform 2. Under the control of the computer, the powder feeder 4 outputs a certain amount of powder 41 of the forming material. The certain amount of powder 41 falls on the surface of the operation platform 2. Then the powder spread device 5 disperses the powder 41 into the forming cylinder 31 and flattens the powder on the powder bed 7 to form a new powder layer.

The electron beam emitting, focusing and scanning device 6 emits the electron beam in the heating mode perform hybrid scan on the new powder layer, and heat and slightsinter the powder in the forming area. The electron beam emitting, focusing and scanning device 6 emits the electron beam 67 in the selective melting mode. The electron beam scans and melts the powder 71 in the formed section of the component. The electron beam emitting, focusing and scanning device 6 emits the electron beam 68 in the electron beam cutting mode. The electron beam 68 cuts the imer outline 75 and the outer outline 74 of the forming material, and performs cutting scanning once or for a plurality of times so as to cut off a rough part of the outlines and unformed powder. Anew deposition layer 71 is deposited on the upper surface of work piece 72.

Repeatedly, new deposition layer is accumulated on the work piece 72 layer by layer until the final shape of the work piece 72 is obtained and the process of additive manufacturing of the work piece is completed.

FIG. 3-FIG. 6 illustrates a hybrid scanning method utilizing the electron beam selective melting and cutting according to an embodiment of the present disclosure. In the melt deposition mode, the electron beam emitting, focusing and scanning device 6 can adjust the melting depth by adjusting the scanning parameters, such as the beam intensity, the moving speed of the focus on the forming plane, the scanning interval of the adjacent scanning paths and the interval time of the adjacent scanning paths.

Figure 4:
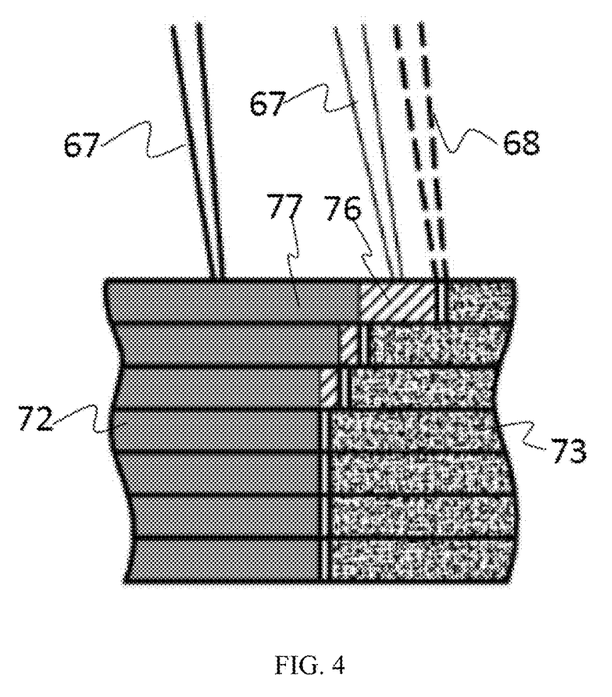
Figure 5:
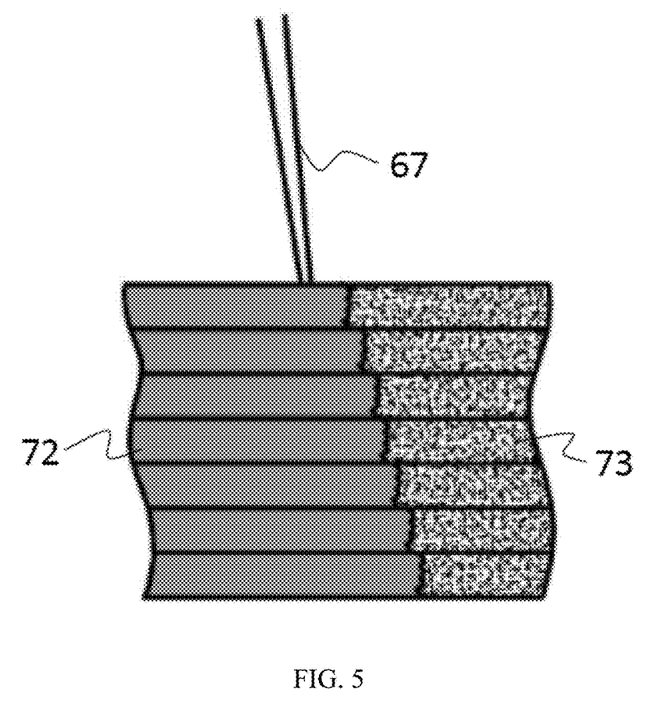
Figure 6:
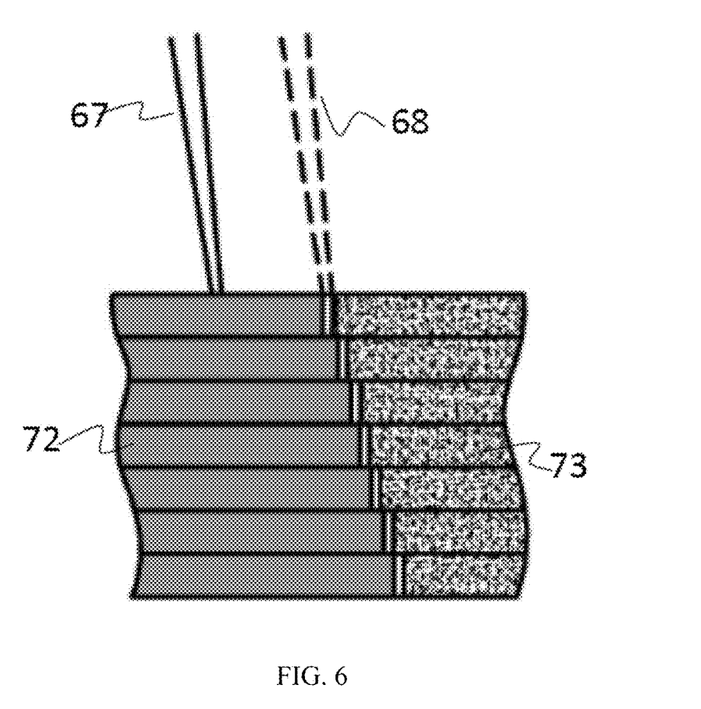

FIG. 3 and FIG. 4 show a schematic view where the current forming layer is greater than or equal to the previous formed layer (in the figure the previous formed layer is below the current forming layer), namely, the outer edges of the current forming layer extend outwards beyond the previous formed layer. FIG. 5 and FIG. 6 show a schematic view where the current forming layer is smaller than the previous formed layer (in the figure the previous formed layer is below the current forming layer), namely, the outer edges of the former forming layer extend outward beyond the current forming layer. FIG. 3 and FIG. 5 shows the forming condition when the function of the electron beam cutting is not added. At this time, the forming powder is only scanned by the electron beam 67 in the selective melting mode. The surface of the formed work piece 72 by melting is not treated. Quality of the surface is rough and the edges are uneven. FIG. 4 and FIG. 6 are schematic views of the scanning area where combined electron beam selective melting and electron beam cutting are utilized.

As illustrated in FIG. 4, in the illustrated upper three layers, for a larger portion 76 of the current forming layer than the previous formed layer (the white portion with a section line in the figure), as the area of the powder bed or the cut outline edge is located below the current forming layer, the melting depth need to be equal to or less than the thickness of the current forming layer, so as to prevent the powder below the current forming layer from sticking to the cut surface of the previous formed layer and affecting the surface quality of the cut surface. For the area 77 (the gray solid part in the figure) where the component entity is located below the current forming layer and to which the current forming layer needs to be fused, the melting depth needs to exceed the thickness of the current forming layer, so that the current forming layer and the previous formed layer can be fully fused. Thus, not only the connecting effect of the upper and lower forming layers can be guaranteed, but also the better surface finish can be guaranteed.

For the lower three layers illustrated in FIG. 4, when the current forming layer is equal to the previous formed layer, that is to say, when the edges of the current forming layer is flush with the edges of the previous formed layer, the melting depth of the current forming layer does not affect the surface quality of the previous formed and cut layer, so the melting depth of the current forming layer needs to exceed the thickness of the current forming layer, so that the current forming layer and the previous formed layer can be fully fused and the cutting plane is smooth. For the condition illustrated in FIG. 6 where the current forming layer is smaller than the previous formed layer, the melting depth of the current forming layer does not affect the surface quality of the previous formed and cut layer, so the melting depth of the current forming layer also needs to exceed the thickness of the current forming layer, so that the current forming layer and the previous formed layer can be fully fused to ensure the cutting effect and the forming quality.

Figure 7:
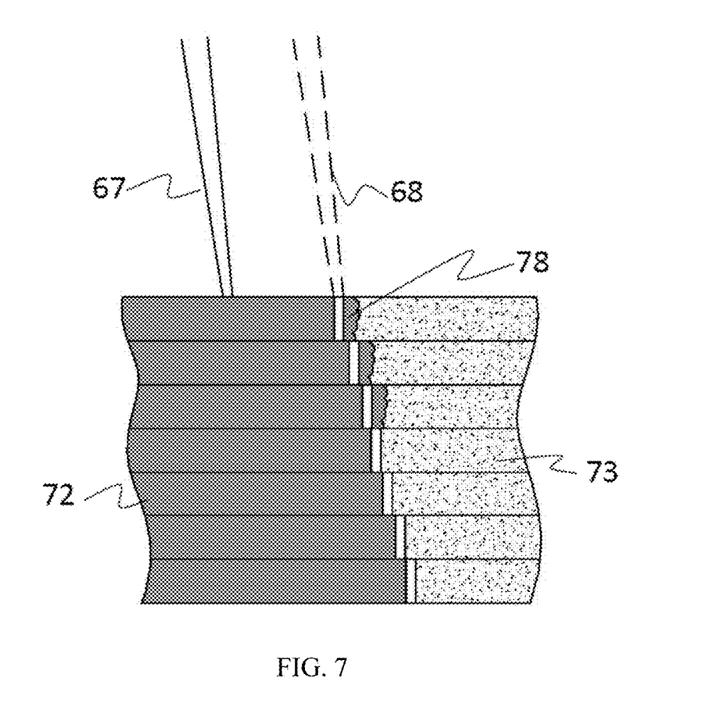

As illustrated in FIG. 7, in the hybrid scanning method using the electron beam selective melting and electron beam cutting according to the embodiment of the present disclosure, the electron beam 68 in the electron beam cutting mode performs outline cutting once or for a plurality of times to directly cut off the rough part 78 and the unscanned powder 73, so as to separate the rough part 78 and the unscanned powder 73 from the formed work piece 72 completely, and hence to obtain the formed component with higher forming precision and higher surface finish.

Embodiment 2

As illustrated in FIG. 8 and FIG. 9, an additive manufacturing apparatus using combined electron beam selective melting and cutting according to some other embodiments of the present disclosure is illustrated, which includes a plurality of electron beam emitting, focusing and scanning devices 6. The electron beam emitting, focusing and scanning device 6 is used for selective melting and cutting. The other components of the additive manufacturing apparatus are similar to the first embodiment, and the process is similar to the first embodiment, and the description thereof will not be repeated herein.

Herein FIG. 8 shows the combination of two electron beam emitting, focusing and scanning devices 6. The electron beam emitted by each of the two electron beam emitting, focusing and scanning devices 6 has three different working modes of heating, melting deposition and electron beam cutting. Moreover, the scanning areas of the two electron beam emitting, focusing and scanning devices 6 overlap only at the edge portion, and at least 90% of the scanning areas do not overlap. The two electron beam emitting, focusing and scanning devices 6 are arranged side by side at the top of the vacuum chamber 1.

Figure 10:
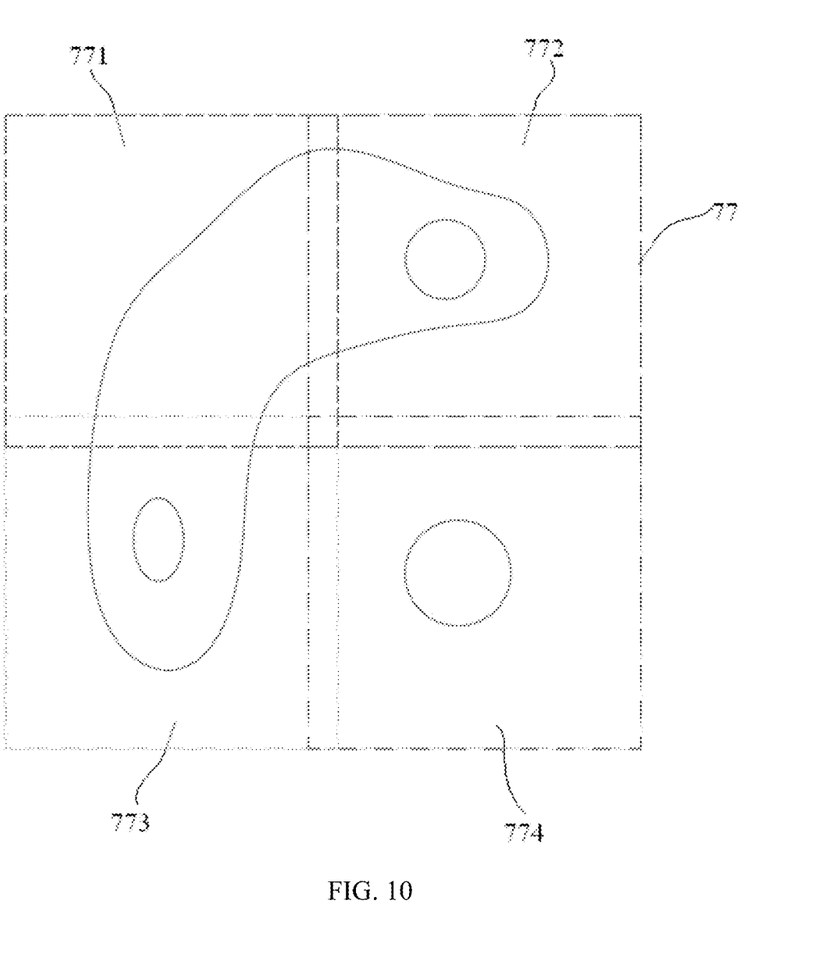
FIG. 10 is a schematic view of a scanning range and a target area of the apparatus illustrated in FIG. 9.

FIG. 9 shows the combination of four electron beam emitting, focusing and scanning devices 6. The electron beam emitted by each of the four electron beam emitting, focusing and scanning devices 6 has three different working modes of heating, melting deposition and electron beam cutting. Moreover, the scanning areas of each electron beam emitting, focusing and scanning device 6 overlap only at the edge portion, and more than 80% of the scanning areas do not overlap. For example, the four electron beam emitting, focusing and scanning devices 6 are arranged in an 2×2 array, the scanning area 771, 772, 773 and 774 of each electron beam emitting, focusing and scanning device 6 are uniform in size and combine into a larger combined scanning area 77 (as illustrated in FIG. 10). There is no gap among the scanning areas of every electron beam emitting, focusing and scanning device 6 (for example, the scanning areas partially overlap or are adjacent) so as to prevent an unscannable region in the forming area. In addition, the four electron beam emitting, focusing and scanning devices 6 can be grouped into an electron beam scanning unit, and a mechanical translational mechanism can be used to obtain a larger scanning and forming area, so as to additively manufacture a three-dimensional component of a larger scale.

In the description of the present disclosure, it should be understood that, the orientation or position relationship indicated by the terms "up", "down", "front", "back", "top", "bottom", "inside" and "outside" thereof are based on the orientation or position relationship illustrated in the drawings. These terms are for convenience and simplification of description and do not indicate or imply that the device or element referred to must have a specific orientation, be constructed and operated in a specific orientation, so these terms shall not be construed to limit the present disclosure. In the description of the disclosure, "a plurality of" means at least two, such as two, three, etc., unless specified otherwise.

In the present disclosure, unless specified otherwise, terms "mounted", "adjacent" "connected", "fixed" and the like are used broadly. For example, fixed connections, detachable connections, or integral connections; may also be mechanical or electrical connections or communication connections; may also be direct connections or indirect connections via intervening structures; may also be inner communications or interactions of two elements, which can be understood by those skilled in the art according to specific situations.

In the present invention, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween.

In the present disclosure, unless specified otherwise and defined, the first feature may be directly contacted by the first and second features or indirectly contacted by the first and second features through the intermediate medium in the second feature "up" or "down".

In the present description, the Reference terms "embodiment" or "example" means that a particular feature, structure, material, or characteristic described in connection with the embodiment or example is included in at least one embodiment or example of the present disclosure. In the present description, the illustrative expressions of the above terms do not need to be directed at the same embodiment or example. Furthermore, the particular features, structures, material, or characteristics may be combined in any suitable manner in one or more embodiments or examples. Besides, without contradicting each other, those skilled in the art may combine and assembly the different embodiments or examples described in this description and the characteristics of different embodiments or examples.

Although the embodiments of the present invention have been shown and described, it is understood that the above-described embodiments are illustrative and are not to be construed as limiting the scope of the invention. The embodiments are subject to variations, modifications, substitutions and variations.

The invention claimed is:

1. An additive manufacturing apparatus utilizing combined electron beam selective melting and electron beam cutting, comprising:
   a vacuum forming chamber;
   a workbench, a forming area of the workbench being provided at least in the vacuum forming chamber;
   a powder supply device configured to spread powder on the forming a rea;
   at least one electron beam emitting, focusing and scanning device arranged at a top of the vacuum forming chamber and directly above the forming area and movable relative to the workbench, a scanning range of the electron beam device covering at least a part of the forming area and the electron beam device being able to generate a continuous electron beam and a pulsed electron beam; and
   a controller configured to control each electron beam device to operate to emit an electron beam in three modes:
   heating, selective melting and electron beam cutting, an acceleration voltage of the electron beam emitted by the electron beam device varying fully from 10 kV to 200 kV;
   wherein the workbench comprises:
      an operation platform, the forming area being provided in the operation platform; and a piston-type forming cylinder device disposed below the operation platform and comprising a forming cylinder and a piston-type elevating device;
      wherein an upper edge of the forming cylinder is flush with the operation platform, and the piston-type elevating device is able to move up and down in the forming cylinder;
   wherein the powder supply device comprises:
      a powder feeder configured to supply the powder to an upper surface of an operation platform; and
      a powder spread device provided on the operation platform and configured to disperse the powder into the forming cylinder and flatten the powder;
   wherein the electron beam device comprises:
      a casing provided outside the vacuum forming chamber;
      a filament configured to generate a n electron beam and provided in the casing;
      a cathode provided in the casing and linked to the filament;
      a grid electrode provided in the casing and located below the filament;
      an anode provided in the casing and located below the grid electrode;
      a focusing coil provided in the casing and located below the anode; and
      a pair of X/Y deflection coils provided in the casing and located below the focusing coil;
   wherein the powder supply device spreads the powder onto the forming area to form a powder bed with a certain thickness;
   wherein the electron beam device emits the electron beam in the heating mode, and the electron beam scans and preheats the powder bed so as to heat and slightly sinter the powder;
   wherein the electron beam device emits the electron beam in the selective melting mode, and the electron beam scans and melts the powder in a section so as to melt and deposit the powder to form a section layer of a required component;
   wherein the electron beam device emits the electron beam in the electron beam cutting mode, and the electron beam scans and cuts inner and outer outlines of a section of the component once or for a plurality of times to remove or cut off a rough edge and welded powder on the outlines so as to obtain precise and smooth inner and outer outlines of the section of the component;
   wherein the powder is spread on the section layer of the component with the cut section outlines, and the heating, melting deposition and outline cutting are carried out in sequence, manufacturing process of spreading, heating, melting deposition and outline cutting layer by layer is repeated until a required three-dimensional solid component is obtained;
   wherein in the heating mode, the electron beam emitted by the electron beam device focuses above or below a forming plane, a scanning speed is from 0.01 m/s to 50 m/s, two adjacent scanning paths do not overlap each other, and a scanning interval is greater than 10 microns;
   wherein in the selective melting mode, the electron beam emitted by the electron beam device focuses on a forming plane, a scanning speed is from 0.01 m/s to 10 m/s, two adjacent scanning paths do not overlap each other, and a scanning interval is greater than 10 microns, and the electron beam device regulates a melting depth by adjusting a beam intensity of the electron beam, a moving speed of a focus that is focused on the forming plane, the scanning interval of adjacent scanning paths, and an interval time of the adjacent scanning paths, for an area where the component entity is below a current forming layer and the current forming layer needs to fuse with the component entity, the melting depth exceeds a thickness of the current forming layer, and for another area where the powder bed or the cut edge of outline is below the current forming layer, the melting depth is equal to or less than the thickness of the current forming layer; and
   wherein in the electron beam cutting mode:
      the continuous electron beam emitted by the electron beam device is focused on a plane of the section of the component, a scannings peed is from 1 m/s to 50 m/s, and either two adjacent scanning paths overlap completely or a scanning interval is less than 8 microns; or
      the pulsed electron beam emitted by the electron beam device focuses on a plane of the section of component, a pulse frequency is 1 Hz to 100 kHz, a scanning speed is 0.1 m/s to 5 m/s, and either two adjacent scanning paths overlap each other or a scanning interval is less than 8 microns.

2. The additive manufacturing apparatus according to claim 1, wherein the powder comprises ceramic powder and/or metal powder.

3. The additive manufacturing apparatus according to claim 1, wherein two electron beam devices are provided, wherein the scanning areas of the two electron beam devices overlap at edge portions, and at least 90% of the scanning areas do not overlap.

4. The additive manufacturing apparatus according to claim 1, wherein at least four electron beam devices arranged in an array are provided, wherein the
scanning areas of every electron beam device overlap at edge portions, and at least 80% of the scanning areas do not overlap.

5. The additive manufacturing apparatus according to claim 1, wherein a pressure of the vacuum forming chamber is less than 10 Pa and the vacuum forming chamber is refilled with inert gas to prevent excess of disproportionate element evaporation.

* * * * *